United States Patent
Tsunoda et al.

(10) Patent No.: US 8,710,468 B2
(45) Date of Patent: Apr. 29, 2014

(54) METHOD OF AND APPARATUS FOR EVALUATING AN OPTIMAL IRRADIATION AMOUNT OF AN ELECTRON BEAM FOR DRAWING A PATTERN ONTO A SAMPLE

(75) Inventors: Dai Tsunoda, Yokohama (JP); Masahiro Shoji, Yokohama (JP); Hiroyuki Tsunoe, Sagamihara (JP); Shuji Hada, Yokohama (JP); Ayuko Sato, Yokohama (JP)

(73) Assignee: Nippon Control System Corporation (JP)

( * ) Notice: Subject to any disclaimer, the term of this patent is extended or adjusted under 35 U.S.C. 154(b) by 0 days.

(21) Appl. No.: 13/823,981

(22) PCT Filed: Jul. 27, 2011

(86) PCT No.: PCT/JP2011/067161
§ 371 (c)(1),
(2), (4) Date: Mar. 15, 2013

(87) PCT Pub. No.: WO2012/035892
PCT Pub. Date: Mar. 22, 2012

(65) Prior Publication Data
US 2013/0193354 A1 Aug. 1, 2013

(30) Foreign Application Priority Data

Sep. 17, 2010 (JP) .................................. 2010-209165

(51) Int. Cl.
*H01J 37/00* (2006.01)
*H01J 37/302* (2006.01)
(52) U.S. Cl.
CPC .................................. *H01J 37/3026* (2013.01)
USPC ................. 250/492.22; 250/492.1; 250/492.2

(58) Field of Classification Search
CPC ................... H01J 30/3026; H01J 2237/31769; H01J 2237/31762
USPC ............................... 250/492.1, 492.2, 492.22
See application file for complete search history.

(56) References Cited

U.S. PATENT DOCUMENTS 5,278,421 A * 1/1994 Yoda et al. ............... 250/492.22
5,305,225 A * 4/1994 Yamaguchi et al. .......... 700/160

(Continued)

FOREIGN PATENT DOCUMENTS

JP 6-120102 A 4/1994
JP 9-289164 A 11/1997

OTHER PUBLICATIONS

International Search Report issued Oct. 11, 2011 for PCT/JP2011/067161.

*Primary Examiner* — David A Vanore
(74) *Attorney, Agent, or Firm* — Rossi, Kimms & McDowell, LLP

(57) ABSTRACT

Stored energy is evaluated for each of segmented regions, and using the evaluated stored energy, an optimal irradiation amount for an electron beam is evaluated by a conjugate gradient method. The evaluated stored energy is used instead of calculating a determinant (Apk) in the procedure that includes calculation of the determinant (Apk) from among repeated calculation procedures that follow the conjugate gradient method and seek to answer a simultaneous linear equation (Ax=b) with a matrix (A) as a coefficient. Thus it is possible to evaluate the optimal irradiation amount for an electron beam with a high processing speed and a high degree of accuracy, and without expressly requiring the calculation of Apk, by managing the giant matrix (A) comprising numerous factors according to reduction of lines of circuitry in a circuit pattern.

8 Claims, 7 Drawing Sheets

(56) References Cited

U.S. PATENT DOCUMENTS

| | | | |
|---|---|---|---|
| 6,145,118 A * | 11/2000 | Tomita | 250/492.22 |
| 7,569,842 B2 * | 8/2009 | Takita | 250/492.22 |
| 8,048,600 B2 * | 11/2011 | Ogino | 430/30 |
| 2001/0051766 A1 * | 12/2001 | Gazdzinski | 600/309 |
| 2006/0068301 A1 * | 3/2006 | Hirukawa | 430/5 |
| 2009/0075183 A1 * | 3/2009 | Cecil | 430/5 |
| 2012/0061593 A1 * | 3/2012 | Kawase | 250/492.3 |
| 2013/0193354 A1 * | 8/2013 | Tsunoda et al. | 250/492.22 |

* cited by examiner

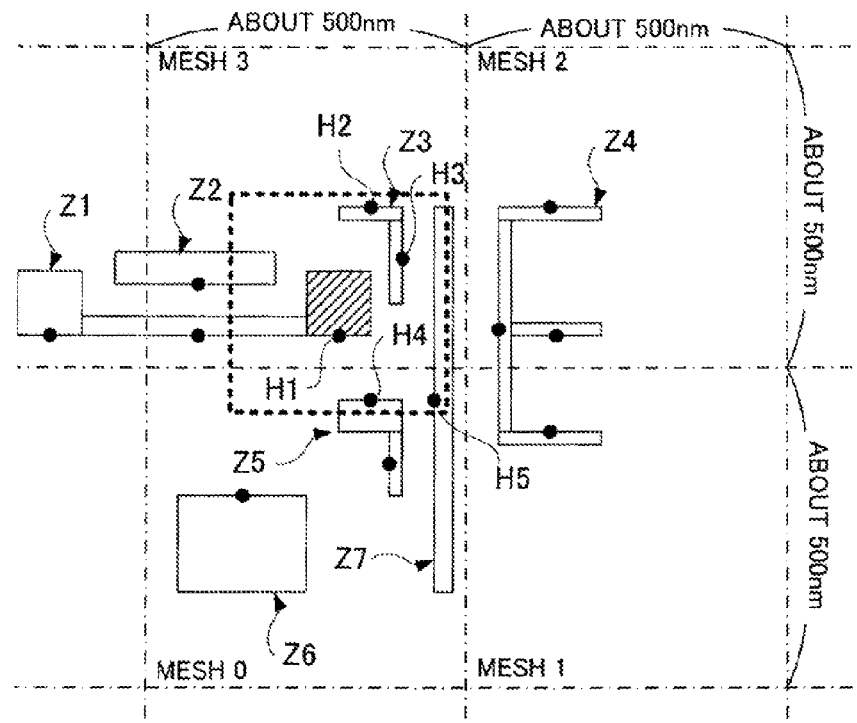
F I G. 6
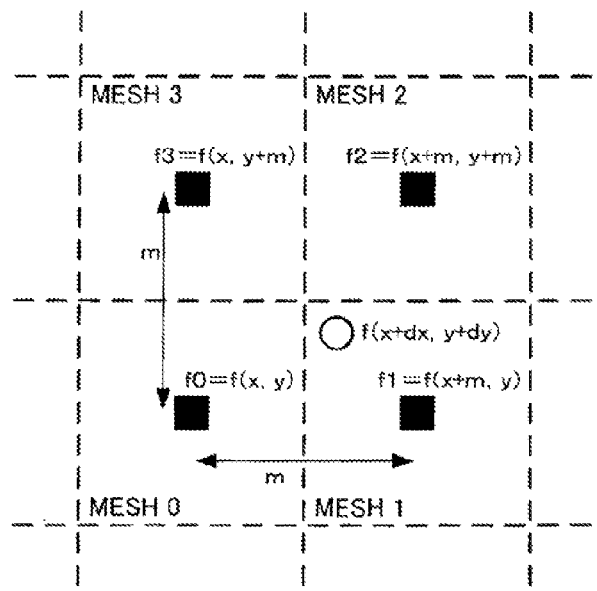
F I G. 7

METHOD OF AND APPARATUS FOR EVALUATING AN OPTIMAL IRRADIATION AMOUNT OF AN ELECTRON BEAM FOR DRAWING A PATTERN ONTO A SAMPLE

TECHNICAL FIELD

The present invention relates to a drawing method, device and program for drawing a desired circuit pattern onto a sample, such as a mask substrate, by use of an electron beam. More particularly, the present invention relates to a technique for evaluating, at a high speed and with a high accuracy, an electron beam irradiation amount optimal to reduce size variation of the circuit pattern caused by a proximity effect.

BACKGROUND ART

With recent further integration of semiconductor integrated circuits, such as LSIs, circuit sizes and circuit line widths required of semiconductor devices have been miniaturized year by year. In order to form a circuit pattern of desired dimensions and line widths, a high-accuracy original pattern (reticle or mask) is required. As an example of a device for creating such an original pattern, there has heretofore been known a drawing device which employs a so-called lithography technique for drawing an original pattern, for example, by irradiating an electron beam onto a sample, such as a metal substrate (e.g., mask substrate), having a resist film applied thereto.

When an electron beam is irradiated onto a sample, such as a mask substrate, there would appear an influence called "proximity effect" that varies a size of a resist pattern formed on the sample. More specifically, the proximity effect is a phenomenon where the electron beam is irradiated even onto unintended portions of the sample due to front-scattered electron and backscattered electron produced by the irradiated electron colliding against the resist and metal substrate with the result that line widths etc. of the resist pattern are caused to vary depending mainly on a density of a circuit pattern. The conventionally-known drawing device would present the inconvenience that an adverse influence of the proximity effect becomes more noticeable with even further miniaturization of the circuit.

To address the foregoing inconvenience, there has been proposed an irradiation amount correction method which determines, in accordance with a density of a circuit pattern, an optimal electron beam irradiation amount of an electron beam (also referred to as "optimal irradiation amount" or "optimal dose amount") to reduce the line width of a resist pattern etc. caused by a proximity effect. More specifically, according to the irradiation amount correction method, control is performed to reduce a time length of the electron beam irradiation in a region where the circuit pattern is dense because the substantive electron beam irradiation amount would become excessive in such a dense-circuit-pattern region, while control is performed to increase the time length of the electron beam irradiation in a region where the circuit pattern is coarse because the substantive electron beam irradiation amount would become insufficient or short in such a coarse-circuit-pattern region. Such arrangements can reduce line width variation of the resist pattern caused by the proximity effect. Among examples of the method for determining an optimal electron beam irradiation amount are ones disclosed in Non-patent Literature 1 and Patent Literature 1 identified below.

PRIOR ART LITERATURE

Non-Patent Literature

Non-patent Literature 1: M. Parikh, J. Appl. Phys 50 (1979), pp. 4371-4383

Patent Literature

Patent Literature 1: Japanese Patent Application Laid-open Publication No. HEI-9-289164

According to the method disclosed in Non-patent Literature 1, relationship between the electron beam irradiation amounts (dose amounts) and amounts of exposure at predetermined positions (hereinafter referred to as "evaluation points") of a circuit pattern formed on a sample is expressed by a determinant (determinant of matrix) representation shown in Mathematical Expression 1 below, and then a reverse determinant of the determinant is evaluated to thereby evaluate or calculate an optimal electron beam irradiation amount at each of the above-mentioned positions; such a method is called "self-alignment method", "determinant method" or the like. The determinant of matrix shown in Mathematical Expression 1 (where FD=E) represents, in an equation, a target condition that "stored energy is equal at all of the evaluation points" by taking into account respective influences from a plurality of rectangles regions obtained by dividing or segmenting various figures, constituting the circuit pattern formed on the sample, on a per-beam-irradiation-unit basis) and using mathematical expressions of energy scattering as shown in Mathematical Expression 2 and Mathematical Expression 3 below.

$$\begin{bmatrix} F_{1,1} & F_{2,1} & \ldots & F_{m,1} \\ F_{1,2} & F_{2,2} & \ldots & \\ \ldots & \ldots & \ldots & \ldots \\ F_{1,n} & \ldots & \ldots & F_{m,n} \end{bmatrix} \begin{bmatrix} D_1 \\ D_2 \\ \ldots \\ D_m \end{bmatrix} = E_{threashold} \begin{bmatrix} 1 \\ 1 \\ \ldots \\ 1 \end{bmatrix}$$

[Mathematical Expression 1]

Note, however, that Mathematical Expression 1 is an equation assuming that there are n evaluation points and m rectangles. $D_i$ represents a dose amount of the rectangle i, and $E_{threashold}$ represents a target value of stored energy at each of the evaluation points (which is a common value or constant).

Here, elements (==1, . . . m, j=1, . . . n) $F_{ij}$ of the above correlation function matrix are calculated, for example, in accordance with Mathematical Expression 2 and Mathematical Expression 3 below.

$$Fij = \int psf(\vec{p} - \vec{p}_j) dp$$

[Mathematical Expression 2]

The elements $F_{ij}$ of the above correlation function matrix indicate magnitudes of scattering actions of energy from the rectangles i at the evaluation points j.

$$psf(r) = \frac{C}{1+\eta}\left(\frac{1}{\alpha^2}\exp\left(-\frac{r^2}{\alpha^2}\right) + \frac{\eta}{\beta^2}\exp\left(-\frac{r^2}{\beta^2}\right)\right)$$

[Mathematical Expression 3]

Mathematical Expression 3 is a Double Gaussian approximation equation.

In Mathematical Expression 3 above, r represents a distance from an incident point, C represents a constant, η represents a ratio between an amount of exposure of a resist by front scattering of the electron beam and an amount of exposure of the resist by back scattering of the electron beam (proximity effect correction coefficient), and α and β are each a predetermined value representing extent of front scattering or back scattering (front scattering diameter or back scattering diameter) that is determined depending on an acceleration voltage. The values α and β are, for example, (27 nm and 2 μm) when the acceleration voltage is 20 Kev, (30 nm and 10 μm) when the acceleration voltage is 50 Kev, and (10 nm and 32 μm) when the acceleration voltage is 100 Kev.

Further, in Mathematical Expression 3 above, the PSF function represents an ultimate energy distribution measured when the electron beam has been irradiated onto a given point of the sample, and in many cases, the PSF function approximates, for example, front scattering and back scattering, in Gaussian distributions. In such cases, the PSF function can be represented by a Double Gaussian approximation equation like Mathematical Expression 3 above.

The advantages of the aforementioned self-alignment method are that an accurate optimal irradiation amount can be obtained if the rectangle, for which an irradiation amount is to be set, is made sufficiently small in size, and that it can be evaluated by using a Gaussian elimination as a solution to a simultaneous linear equation. On the other hand, the aforementioned self-alignment method would present the following disadvantage. Namely, because the quantity of necessary arithmetic operations or calculations is proportional to the cube of the number of the (segmented) rectangles, a minute circuit pattern, such as an LSI pattern, would be segmented into a greater number of rectangles as the size of the circuit pattern is reduced, and thus, an enormous calculation time (e.g., several hundreds hours to several thousands hours per LSI chip) would be required.

Further, the method disclosed in Patent Literature 1, on the other hand, is a method where a sample is segmented into a plurality of meshes on a per-chip basis and an optimal irradiation amount is calculated or evaluated collectively for each of the meshes rather than individually for each of the rectangles (this method is called "representative figure method"). To explain briefly a sequence of operations of the method, a representative figure (i.e., one of divided or segmented rectangles) is obtained, as a first step, for each of the meshes on the basis of parts of figures (circuit pattern) included in the mesh. Then, as a second step, an initial value of an approximate optimal irradiation amount $D_k$ (k=0: k represents a number of repetitions) of each of the meshes is set on the basis of Mathematical Expression 4 below.

$$D_{k=0} = \frac{1/2 + \eta}{1/2 + \eta \int g(x-x')dx'} \quad \text{[Mathematical Expression 4]}$$

Here, η represents a ratio between an amount of direct exposure of a resist by an electron beam and an amount of exposure of the resist by a contribution of back scattering (proximity effect correction coefficient), and g(x) is, for example, a Gaussian function. Although various proposals have heretofore been made for a specific expression of the Gaussian function g(x) in view of a material of a substrate and approximation used, an explanation of such proposals is omitted here.

As a third step, a correction amount $d_{k+1}$ is calculated in accordance with Mathematical Expression 5 below on the basis of the above-mentioned approximate optimal irradiation amount $D_k$.

$$d_{k+1} = \frac{-e_k(1/2 + \eta)}{1/2 + \eta \int g(x-x')dx'} \quad \text{[Mathematical Expression 5]}$$

Here, $$e_k = C - E_k \quad \text{[Mathematical Expression 6]}$$

$$E_k = K\left[\frac{D_k}{2} + \eta \int D_k g(x-x')dx\right] \quad \text{[Mathematical Expression 7]}$$

$E_k$ in Mathematical Expression 7 above represents stored energy in each of the meshes when the assigned state of the irradiation amount is the above-mentioned approximate optimal irradiation amount $D_k$. Further, $e_k$ in Mathematical Expression 6 above represents an error between a predetermined target energy value C (constant) in each of the meshes and the stored energy $E_k$ in the mesh calculated by Mathematical Expression 7 above.

As a fourth step, in order to correct the error $e_k$ between the target value C and the stored energy $E_k$, the correction amount $d_{k+1}$ calculated by Mathematical Expression 5 above is added to the approximate optimal irradiation amount $D_k$ calculated by Mathematical Expression 4, so that a new approximate optimal irradiation amount $D_{k+1}$ (=$D_k+_{k+1}$) is re-set. Then, until the re-set, new approximate optimal irradiation amount $D_{k+1}$ converges, until the error $e_k$ reaches within a predetermined value, or until the number of repetitions (k) reaches a predetermined number, the aforementioned third step and fourth steps are performed repeatedly, to thereby evaluate an optimal irradiation amount for each of the plurality of meshes (i.e., optimal irradiation amount common to rectangles included in the mesh).

The advantage of such a representative figure method is that an optimal irradiation amount can be obtained per mesh, i.e. an optimal irradiation amount common to one or more rectangles included in the mesh, can be obtained in accordance with only an influence of back scattering with an influence of front scattering ignored and thus necessary calculations can be performed at a high speed. On the other hand, the disadvantage of the representative figure method is that, with an influence of front scattering ignored, an optimal irradiation amount cannot be evaluated in a case where there is a need to draw, on a sample, a more miniaturized circuit pattern for which an influence of front scattering ignored cannot be ignored.

Namely, in the case where the proximity effect is corrected by the conventionally-know irradiation amount correction method, it is difficult to use the self-alignment method with highly-integrated semiconductor devices, such as LSI patterns, due to a time constraint because the aforementioned self-alignment method would require an even more calculation time to cope with presently-demanded miniaturization of circuit patterns. The aforementioned representative figure method, on the other hand, would present the problem that when used to draw, on a sample, a more miniaturized circuit pattern for which an influence of front scattering ignored cannot be ignored, it is unable to achieve a sufficient correction accuracy. Further, the aforementioned conventionally-known methods would also present the inconvenience that they cannot be used for so-called Gray Scale PEC "Proximity Effect Correction" designed to form a pattern of a three-dimensional shape after development of a resist.

SUMMARY OF INVENTION

In view of the foregoing, it is an object to provide an improved drawing method, device and program which can evaluate, with a high accuracy and at a high processing or calculating speed, an optimal electron beam irradiation amount in accordance with a conjugate gradient method taking into consideration not only an influence of back scattering but also an influence of front scattering, as well as a computer-readable storage medium containing such a program.

In order to accomplish the aforementioned object, the present invention provides an improved drawing method for evaluating an optimal irradiation amount of an electron beam for each position within a desired pattern to be drawn onto a sample and drawing the desired pattern onto the sample by irradiating the electron beam in accordance with the evaluated optimal irradiation amount, which comprises: a step of segmenting the pattern into a plurality of regions each having a predetermined size; a step of evaluating, for each of the segmented regions, stored energy that is a substantive irradiation amount of the electron beam; and a step of evaluating the optimal irradiation amount on the basis of a conjugate gradient method using the stored energy evaluated for each of the regions.

In a preferred embodiment of the present invention, the step of evaluating the optimal irradiation amount on the basis of a conjugate gradient method uses the evaluated stored energy, instead of calculating a determinant $Ap_k$, in the following repeated calculation procedure based on the conjugate gradient method for finding a solution to a simultaneous linear equation of $Ax=b$ with a matrix A as a coefficient:

$$\alpha_k = (r_k \cdot r_k)/(p_k \cdot Ap_k)$$

$$x_{k+1} = x_k + \alpha_k p_k$$

$$r_{k+1} = r_k - \alpha_k Ap_k$$

$$\beta_k = (r_{k+1} \cdot r_{k+1})/(r_k \cdot r_k)$$

$$p_{k+1} = r_k + \beta_k p_k$$

$$k = k+1.$$

Further, the step of evaluating the stored energy includes a step of calculating stored energy caused by front scattering of the electron beam, and a step of calculating stored energy caused by back scattering of the electron beam.

According to the present invention, stored energy that is a substantive irradiation amount of the electron beam is evaluated for each of the segmented regions, and an irradiation amount optimal to minimize or reduce size variation of the circuit pattern caused by the proximity effect is evaluated in accordance with the conjugate gradient method using the stored energy evaluated for each of the regions. At that time, in the repeated calculation procedure based on the conjugate gradient method, designed to find a solution to the simultaneous linear equation of $Ax=b$ with the matrix A as a coefficient, and including a calculation of the determinant $Tp_k$, calculations are performed using the evaluated stored energy, instead of calculating the determinant $Ap_k$. Also, in calculating the stored energy, stored energy by the front scattering of the electron beam and stored energy by the rear scattering of the electron beam are calculated separately from each other.

By evaluating an optimal irradiation amount of the electron beam with the repeated calculation procedure based on the conjugate gradient by managing the value of the determinant $Ap_k$ with the stored energy as above, the present invention can eliminate the need for taking the trouble of managing the huge matrix A, comprising a multiplicity of elements corresponding to miniaturization of the circuit pattern, and calculating the determinant $Ap_k$ as done in the conventionally-known method, and thus, the present invention can evaluate an optimal irradiation amount of the electron beam with a high accuracy at a high processing speed, i.e. at a high calculating speed.

The present invention may be constructed and implemented not only as the method invention discussed above but also as an apparatus or device invention. Also, the present invention may be arranged and implemented as a software program for execution by a processor, such as a computer or DSP, as well as a storage medium storing such a software program.

Because stored energy that is a substantive irradiation amount of the electron beam is evaluated for each of the segmented regions and an irradiation amount optimal to minimize or reduce size variation of the circuit pattern caused by a proximity effect is evaluated with the conjugate gradient method using the stored energy evaluated for each of the regions, the present invention achieves the advantageous benefit that it can evaluate an optimal irradiation amount of the electron beam with a high accuracy at a high processing speed, i.e. at a high calculating speed.

BRIEF DESCRIPTION OF DRAWINGS

FIG. 6 is a conceptual diagram showing an example of a chip range for which an optimal irradiation amount is to be calculated on the basis of proximity effect correction;

FIG. 7 is a conceptual diagram explanatory of a sequence of operations for calculating a back scattering intensity the bilinear interpolation.

DESCRIPTION OF EMBODIMENTS

The following paragraphs describe in detail an embodiment of the present invention with reference to the accompanying drawings.

Figure 1:
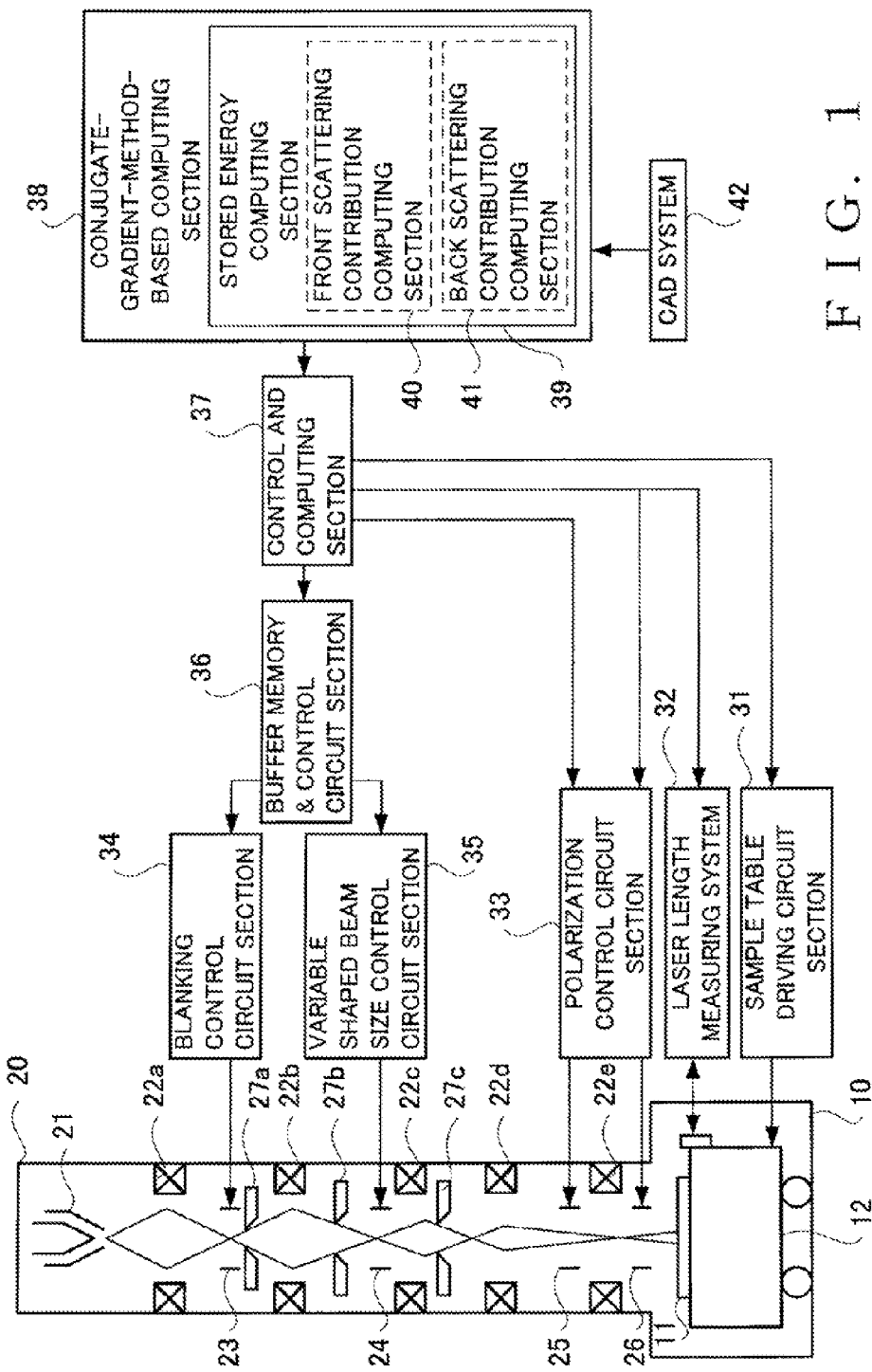
FIG. 1 a conceptual diagram showing an example of a general construction of a drawing device to which is applied a drawing method of the present invention.

FIG. 1 a conceptual diagram showing an example of a general or overall construction of an embodiment of a drawing device to which is applied a drawing method of the present invention. The drawing device shown here is, for example, in the form of an electron-beam drawing device. Reference numeral 10 represents a sample chamber, 11 represents a target (or sample), 12 represents a sample table, 20 an electro-optic lens tube, 21 represents an electron gun, 20a to 22e represent various lens systems, 23 to 26 represent various polarization systems, 27a represents a blanking plate, and 27b and 27c represent beam-forming aperture masks. Further, reference numeral 31 represents a sample table driving circuit section 31, 32 represents a laser length measuring system, 33 represents a polarization control circuit section, 34 represents a blanking control circuit section, 35 represents a variable shaped beam size control circuit section 35, 36 represents a buffer memory and control circuit section, 37 represents a control and computing section 37, 38 represents a conjugate-gradient-method-based computing section, and 42 a CAD system.

Briefly speaking, the electron-beam drawing device shown in FIG. 1 behaves as follows. An electron beam irradiated from the electron gun 21 is turned on and off by the blanking polariscope 23. The electron-beam drawing device is capable of changing an irradiation amount of an electron beam in accordance with a position of irradiation onto the target 11 placed on the sample table 12 by adjusting a time length of the electron beam irradiation onto the target 11. The electron beam passed through the blanking plate 27 is formed into a rectangular beam and variable in size by the beam forming polariscope 24 and beam-forming aperture masks 27b and 27c. The electron beam having been thus formed into a rectangular shape as noted above is polarized and scanned over the target 11 by means of the scanning polariscopes 25 and 26, so that a desired pattern is drawn onto the target 11 by the beam scanning. Namely, a desired pattern to be drawn on the target 11 is segmented into a plurality of combinations of rectangles, and the electron beam is irradiated for each of the segmented rectangles.

An optimal irradiation amount of the electron beam (i.e., irradiation time length of the electron beam) for each of the rectangles is calculated by the conjugate-gradient-method-based computing section 38 on the basis of electron beam exposing original data generated by the CAD system 42. The conjugate-gradient-method-based computing section 38, which is for example in the form of a computer comprising a CPU, ROM, RAM, etc., calculates an optimal irradiation amount of the electron beam for each of the rectangles by correcting a proximity effect. The conjugate-gradient-method-based computing section 38 solves a determinant (i.e., determinant of matrix) (for convenience, this determinant is referred to as "Ax=b") as shown in Mathematical Expression 1 above by use of the conjugate gradient method. Using the conjugate gradient method, the determinant Ax=b can be solved by repetition of multiplication between a correlation function matrix (A) and a vector (x). Thus, the following paragraphs describe a sequence of operations (or procedure) for solving the determinant (Ax=b) by the conjugate gradient method.

First, assume that $r_k=b-Ax_k$, $p_k=r_k$ (k=0) are set as initial values. $p_k$ and $r_k$ represent intermediate variable vectors, and k represents the number of repeated calculations. Then, arithmetic operations or calculations of Mathematical Expressions 8 to 13 are performed repeatedly until a predetermined repetition condition is satisfied, to thereby solve the determinant Ax=b to evaluate the value x. Note that each parenthesized dot (·) in the following mathematical expressions represent an inner product.

$$\alpha_k=(r_k \cdot r_k)/(p_k \cdot Ap_k)$$ [Mathematical Expression 8]

$$x_{k+1}=x_k+\alpha_k p_k$$ [Mathematical Expression 9]

$$r_{k+1}=r_k-\alpha_k Ap_k$$ [Mathematical Expression 10]

$$\beta_k=(r_{k+1} \cdot r_{k+1})/(r_k \cdot r_k)$$ [Mathematical Expression 11]

$$p_{k+1}=r_k+\beta_k p_k$$ [Mathematical Expression 12]

$$k=k+1$$ [Mathematical Expression 13]

"A" of $AP_k$ appearing in the aforementioned sequence of arithmetic operations represents a matrix of a m×n size, and "$p_k$" represents a vector of a magnitude of m (see Mathematical Expression 1 above). Therefore, m×m multiplications have to be performed in order to evaluate the determinant $AP_k$ in an ordinary manner, and such calculations have to be performed per repeated calculation. Thus, it can be understood that reducing the quantity of calculations in the instant processing is very important to reduce or shorten a necessary processing time. Further, because the number of elements in "A" amounts to the square of the number of the rectangles, a great calculating time would be required if the aforementioned calculating sequence is used as-is.

Thus, in order to solve the determinant (Ax=b) at a high speed, the conjugate-gradient-method-based computing section 38 in the instant embodiment includes a stored energy computing section 39. The conjugate-gradient-method-based computing section 38 manages the value of the $Ap_k$ with one stored energy per rectangular element (having one energy evaluation point as will be later described), paying attention to the fact that $Ap_k$ appearing in the aforementioned sequence of operations (or procedure) is equal to stored energy at each energy evaluation point (hereinafter referred to also as "evaluation point") when a dose amount in each of the rectangular elements is "$p_k$". Namely, because the matrix "A" represents behavior of the system, "determinant Ax=b" means that the stored energy at each evaluation point when the dose amount of each of the rectangles is "x" has reached "b". Therefore, the stored energy computing section 39 only has to calculate stored energy at each of the evaluation points and does not have to take the trouble of managing the huge matrix A, comprising a multiplicity of elements that increases or decreases in proportion to the number of the evaluation points and the number of the rectangles, to calculate the value $Ap_k$.

Further, the stored energy computing section 39 includes a front scattering contribution calculation section 40 and a back scattering contribution computing section 41 to separately calculate stored energy contributed or caused by front scattering and stored energy contributed or caused by back scattering, to thereby calculate stored energy at each of the evaluation points. In this way, the instant embodiment of the invention can perform at a high speed the calculation of the optimal irradiation amount of an electron beam for each of the rectangles using the conjugate gradient method. A specific sequence of calculating operations (or calculating procedure) will be detailed later.

Figure 2:
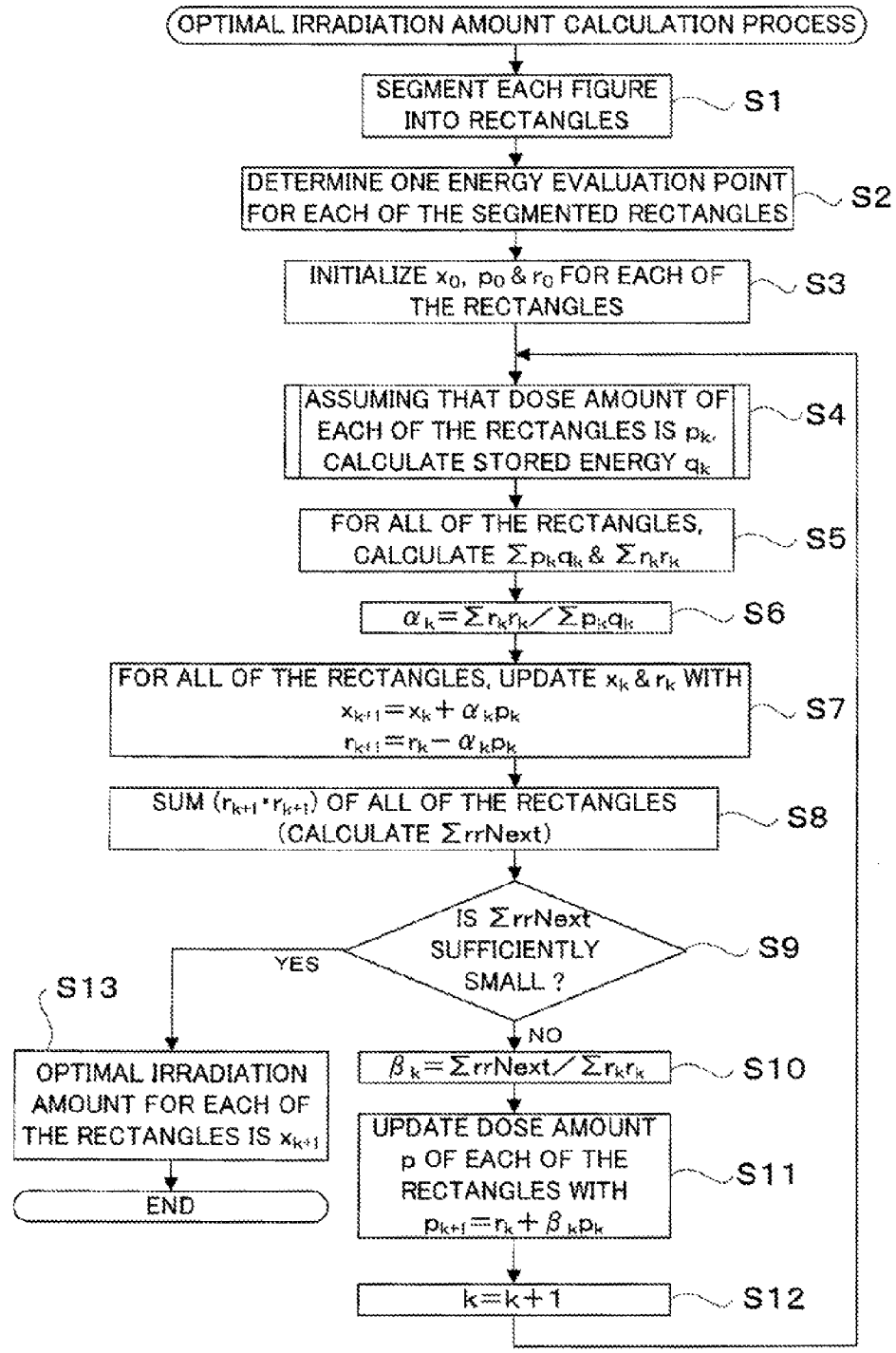
FIG. 2 is a flow chart showing an example of an optimal irradiation amount calculation process performed by a conjugate-gradient-method-based calculation section for calculating an optimal irradiation amount of an electron beam for each of a plurality of rectangles.

The following paragraphs describe a sequence of operations (or procedure) for calculating an optimal irradiation amount of an electron beam for each of the rectangles, with reference to FIG. 6 showing an example of a chip range for which an optimal irradiation amount (optimal dose amount) is to be calculated on the basis of proximity effect correction. FIG. 2 is a flow chart showing an example of an optimal irradiation amount calculation process performed by the conjugate-gradient-method-based calculation section 38 of FIG.

1 for calculating an optimal irradiation amount of an electron beam (i.e., optimal dose amount) for each of the rectangles.

At step S1, each of a plurality of figures (i.e., figures or shapes constituting a circuit pattern) Z1 to Z7 identified on the basis of electron beam exposing original data acquired from the CAD system 42 is appropriately segmented into a plurality of rectangles (or regions). For example, each of the figures Z1 to Z7 is segmented into a plurality of rectangles having a size of about 1/10 of a back scattering diameter. At that time, if the figure has an original shape other than a rectangular shape like the figures Z1, Z3, Z4 and Z5 shown in FIG. 6, the figure is segmented into a combination of a plurality of rectangles of the aforementioned size. In the illustrated example, the figure Z1 is segmented into three rectangles, the figure Z3 into two rectangles, the figure Z4 into four rectangles, and the figure Z5 into two rectangles. In this manner, the figures Z1 to Z7 are each segmented into one or more rectangles different in size. Because such division of the figures Z1 to Z7 into one or more rectangles may be performed using any one of the conventionally-known methods, a detailed description of the segmentation of the figures is omitted here.

At next step S2, one energy evaluation point is determined for each of the segmented rectangles. In the instant embodiment, the middle position of one side of the longest outer peripheral portion of each of the rectangles is set as the energy evaluation point (indicated by a black circle in FIG. 6) in accordance with an ordinary PEC method, as shown in FIG. 6. Such a PEC method employed in the instant embodiment is different from the conventionally-known self-alignment method where the middle position of each of the sides of each of the rectangles is set as the energy evaluation point. Note that, if the Gray Scale PEC method is employed, the center position of each of the rectangles may be set as the energy evaluation point.

At next step S3, initial value "0" is set as a (initial) dose amount $x_0$ of each of the rectangles and suitable target energy values are set as $p_0$ and $r_0$ ($=b-A\,x_0$), as an initial process for solving the determinant $Ax=b$ as shown in Mathematical Expression 1 above. Here, b represents a m-dimensional vector. $p_k$ and $r_k$ represent intermediate variable vectors, and k represents the number of repeated calculations, as noted above. If the ordinary PEC method is employed, target energy values of the outer peripheral portions of the figures Z1 to Z7 to which the individual rectangles belong to are set as the target energy values. But, if the Gray Scale PEC is employed, target stored energy values the figures Z1 to Z7 to which the individual rectangles belong to (or layers including the figures Z1 to Z7) are set as the target energy values.

At step S4, $Ap_k$ appearing in the sequence of operations for solving the determinant ($Ax=b$) by the conjugate gradient method (see Mathematical Expression 8) is calculated by the stored energy computing section 39. In order to calculate the $Ap_k$ value, the stored energy computing section 39 only has to calculate stored energy $g_k$ at the evaluation point, as noted above. The stored energy $q_k$ is energy (distribution) which a resist has obtained as a result of collision of electrons, and it can be calculated by an integral calculation (convolution) between a rectangle to be drawn and a PSF function.

Figure 3:
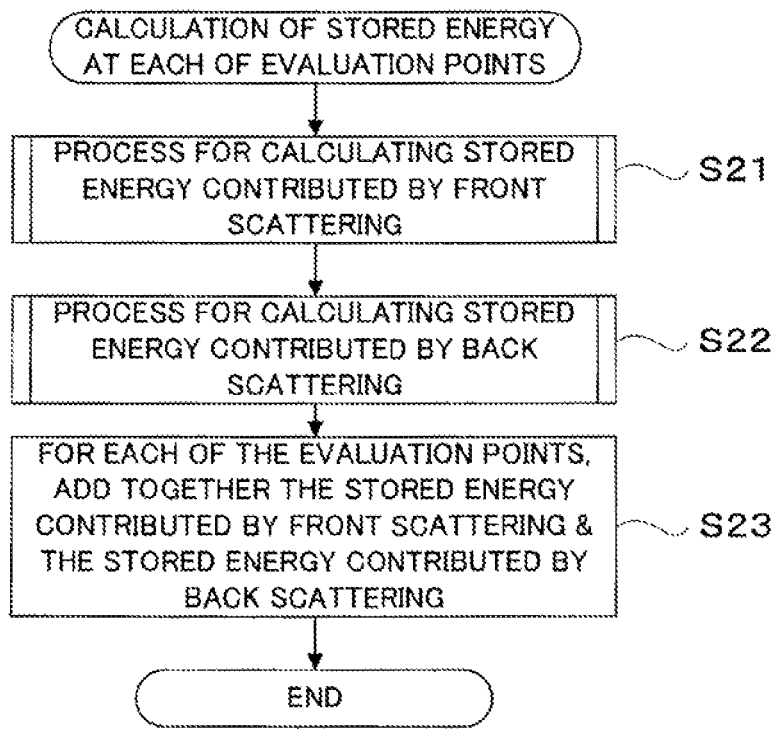
FIG. 3 is a flow chart showing an example of a stored energy calculation process performed by a stored energy calculation section for calculating stored energy at each of a plurality of evaluation points.

Now, with reference to FIG. 3, a description will be given about a sequence of operations (or procedure) for calculating the stored energy $q_k$ at each of the evaluation points. FIG. 3 is a flow chart showing an example sequence of operations (procedure) performed by the stored energy computing section 39 for calculating the stored energy $q_k$ at each of the evaluation points.

At step S21, the stored energy computing section 39 performs a "process for calculating stored energy contributed by front scattering". At next step S22, the stored energy computing section 39 performs a "process for calculating stored energy contributed by back scattering". At following step S23, the stored energy contributed or caused by front scattering and the stored energy to contributed by back scattering, calculated by the aforementioned respective operations, are added (accumulated) together for each of the evaluation points; in this manner, stored energy at each of the evaluation points is calculated.

Figure 4:
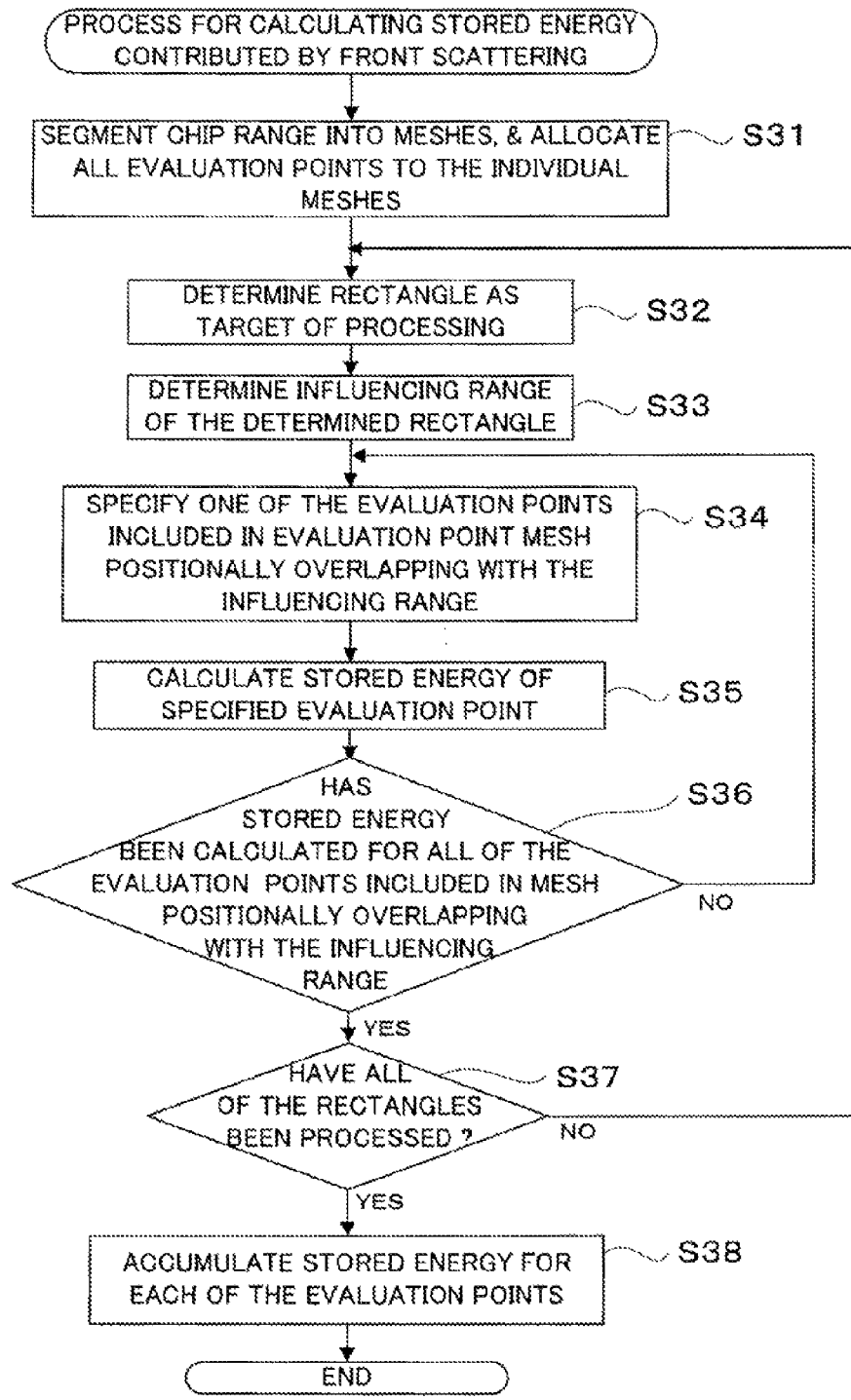
FIG. 4 is a flow chart showing an example of a front-scattering-contributed stored energy calculation process performed by a front scattering contribution calculation section

The following paragraphs describe, with reference to FIG. 4, the "process for calculating stored energy contributed by front scattering" (step S21 of FIG. 3). FIG. 4 is a flow chart showing an example operational sequence of the "process for calculating stored energy contributed by front scattering" that is performed by the front scattering contribution calculation section 40.

At step S31, a sample (one chip in this case) is segmented into meshes (hereinafter referred to as "evaluation point meshes") each having an appropriate size (e.g., 500 nm), and all of the evaluation points are allocated to individual ones of the "evaluation point meshes". In the illustrated example of FIG. 6, four evaluation points, one evaluation point, three evaluation points and five evaluation points are allocated to evaluation point meshes 0 to 3, respectively. At step S32, one of the rectangles obtained by dividing or segmenting the figures Z1 to Z7 is determined as a target of processing. At step S33, an "influencing range" which the one rectangle determined as the target of processing influences is determined. In the illustrated example of FIG. 6, the hatched rectangle is determined as the target of processing, and the influencing range of the hatched rectangle is indicated as a range surrounded by broken lines. Here, the "influencing range" is determined, for example, by extending the outer periphery of the rectangle by about four times the front scattering diameter. Because an influence of the front scattering can occur in a range (nanometer range) near a direct electron beam irradiation position, the influencing range is limited to such a predetermined range in such a manner as to contribute to reduction of the quantity of necessary calculations. Needless to say, the influencing range is not limited to the aforementioned example, and, for example, a circular range having an appropriate radius four times the front scattering diameter about the center of the rectangle may be determined as the influencing range.

At next step S34, one of the evaluation points included in the evaluation point mesh positionally overlapping with the determined "influencing range" is specified (in the illustrated example of FIG. 6, one of the evaluation points H2 to H5 other than the evaluation point H1 of the determined rectangle is specified). Then, at step S35, stored energy at the specified evaluation point is calculated in accordance with Mathematical Expression 14 below that is representative of a stored energy distribution.

$$e(x, y) = \int_b^t \int_l^r psf\left(\sqrt{(x-X)^2 + (y-Y)^2}\right) dX\,dY \qquad \text{[Mathematical Expression 14]}$$

Here, (X, Y) represent coordinates of the evaluation point (e.g., H1) of the determined rectangle, and (x, y) represent coordinates of the specified evaluation point (e.g., one of the evaluation points H2 to H5) for which stored energy is to be calculated.

The PSF function included in Mathematical Expression 14 above is approximated by a Double Gaussian approximation equation as shown in Mathematical Expression 3 above. Here, by the provision of the abovementioned "influencing range", only an influence of front scattering that may be caused by electron beam irradiation to other evaluation points is taken into consideration with an influence of back scattering eliminated. Thus, only the first term, indicative of a contribution of the front scattering, of the Double Gaussian approximation equation as shown in Mathematical Expression 3 is needed with the second term indicative of a contributory portion of the back scattering ignored. Thus, the PSF function employed in Mathematical Expression 14 can be simplified as shown in Mathematical Expression 15.

$$psf(r) = \frac{C}{1+\eta}\left(\frac{1}{\alpha^2}\exp\left(-\frac{r^2}{\alpha^2}\right)\right) \quad \text{[Mathematical Expression 15]}$$

Then, at step S36, a determination is made as to whether the aforementioned stored energy calculation has been performed for all of the evaluation points included in the "evaluation point mesh" positionally overlapping with the determined "influencing range". If the aforementioned stored energy calculation has not been performed for all of the evaluation points included in the "evaluation point mesh" positionally overlapping with the determined "influencing range" as determined at step S36 (i.e., NO determination at step S36), the process reverts back to the operation of step S34 to calculate stored energy for another one of the evaluation points in the aforementioned manner. If, on the other hand, the aforementioned stored energy calculation has been performed for all of the evaluation points included in the "evaluation point mesh" positionally overlapping with the determined "influencing range" as determined at step S36 (i.e., YES determination at step S36), a further determination is made, at step S37, as to whether the aforementioned operations have been performed on all of the rectangles of the figures Z1 to Z7.

If the aforementioned operations have not been performed on all of the rectangles of the figures Z1 to Z7 as determined at step S37 (i.e., NO determination at step S37), the process reverts back to the operation of step S32. If, on the other hand, the aforementioned operations have been performed on all of the rectangles of the figures Z1 to Z7 as determined at step S37 (i.e., YES determination at step S37), the stored energy at each of the evaluation points, calculated by the aforementioned process, is accumulated for each of the evaluation points, after which the process for calculating stored energy contributed by front scattering is brought to an end. In the aforementioned manner, stored energy contributed by the front scattering is evaluated for the one evaluation point determined for each of the rectangles defined by segmenting the figures. Namely, in the instant embodiment, in view of the fact that the range which the front scattering can influence is small and there is no interaction to most of the other evaluation points, an interaction is calculated with respect to only "nearby evaluation points" located within the influencing range which the front scattering can influence, so that the stored energy contributed by the front scattering can be evaluated at a high calculation speed.

Figure 5:
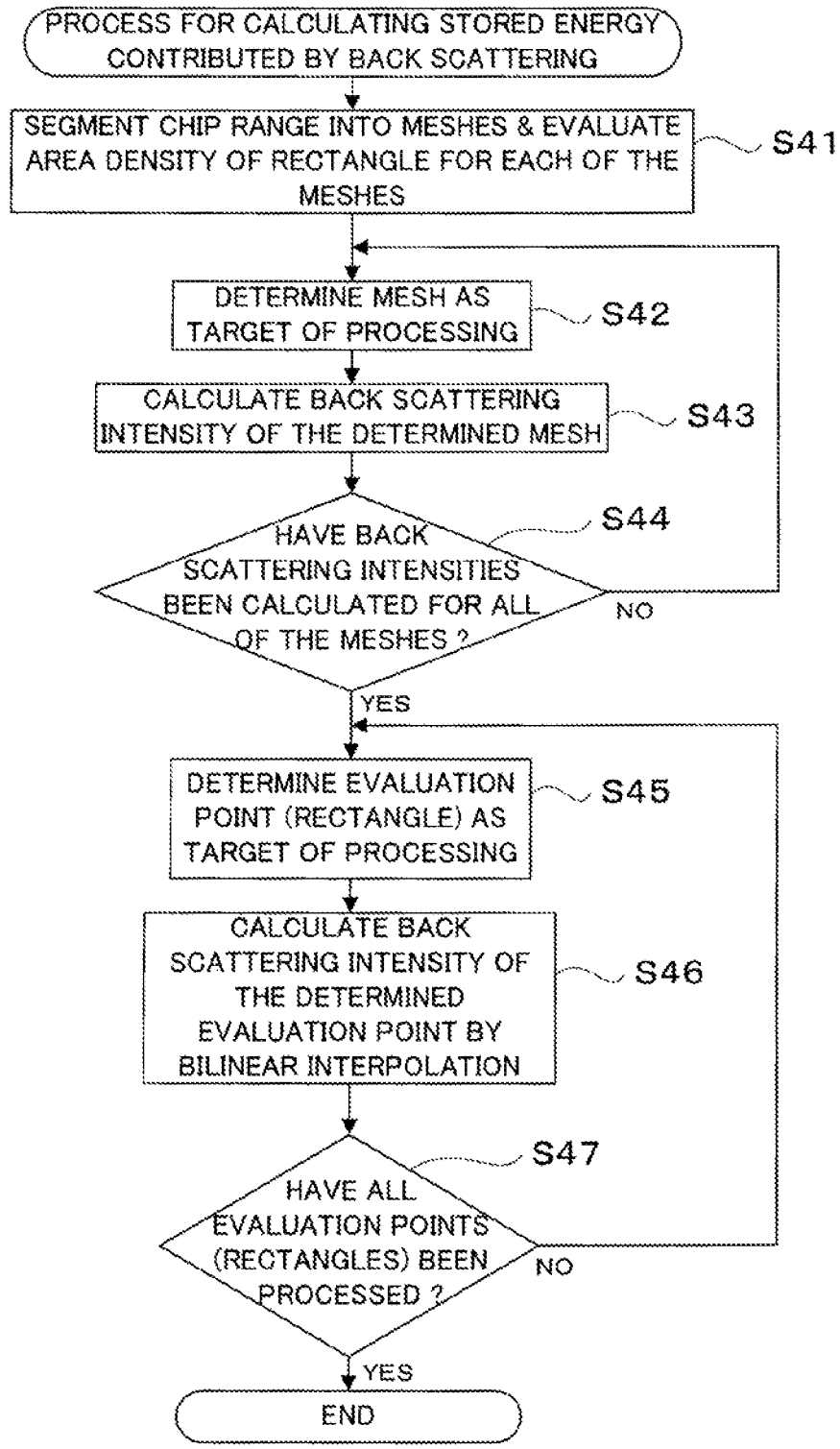
FIG. 5 is a flow chart showing an example of a back-scattering-contributed stored energy calculation process performed by a back scattering contribution calculation section.

The following paragraphs describe, with reference to FIG. 5, the "process for calculating stored energy contributed by back scattering" (step S22 of FIG. 3). FIG. 5 is a flow chart showing an example operational sequence of the "process for calculating stored energy contributed by back scattering" performed by the back scattering contribution calculation section 41.

At step S41, a sample (one chip in this case) is segmented into meshes each having an appropriate size (e.g., in a range of 1 μm-(about ⅒ of a back scattering diameter)), and then, for each of the segmented meshes, a ratio of an area of figures to the area of the mesh is evaluated or calculated to thereby create a "density map". Here, in view of the fact that an influence of back scattering occurs in positions (in a micrometer range) away from a direct electron beam irradiated position, the sample is segmented into meshes each being a large area of about 1 μm as compared to the mesh employed in the front scattering contribution calculation. For example, a part of the figure Z1, a part of the figure Z2, the whole of the figure Z3 and a part of the figure Z7 are contained in "mesh 3" shown in FIG. 6. The abovementioned "density map" represents a ratio of a sum of respective areas of the parts and whole of the individual figures to the total area of mesh 3. At step S42, one of the segmented meshes is determined as a target of processing.

At step S43, an integral calculation (convolution) between the "density map" and the PSF function obtained in accordance with Mathematical Expression 14 above. In this manner, stored energy contributed by back scattering (hereinafter referred to as "back scattering intensity") at the center position of each of the meshes is calculated. Here, only an influence of the back scattering that can be caused by the electron beam irradiation is taken into consideration with an influence of the front scattering eliminated, and thus, only the second term, indicative of a contribution of the back scattering, of the Double Gaussian approximation equation shown in Mathematical Expression 3 is needed with the first term indicative of a contribution of the front scattering ignored. Thus, the PSF function employed in Mathematical Expression 14 can be simplified as shown in Mathematical Expression 16 below.

$$psf(r) = \frac{C}{1+\eta}\left(\frac{\eta}{\beta^2}\exp\left(-\frac{r^2}{\beta^2}\right)\right) \quad \text{[Mathematical Expression 16]}$$

Then, at step S44, a determination is made as to whether the aforementioned calculation of the back scattering intensity has been performed for all of the segmented meshes. If the aforementioned calculation of the back scattering intensity has not been performed for all of the segmented meshes as determined at step S44 (i.e., NO determination at step S44), the process reverts back to the operation of step S42 to calculate a back scattering intensity for another one of the meshes in the aforementioned manner. If, on the other hand, the aforementioned calculation of the back scattering intensity has been performed for all of the segmented meshes as determined at step S44 (i.e., YES determination at step S44), one of the evaluation points is specified at step S45.

At next step S46, a back scattering intensity (stored energy) at the specified evaluation point is evaluated on the basis of respective back scattering intensities of surrounding four meshes including the specified evaluation point. At that time, the back scattering intensity at the specified evaluation point (stored energy) is evaluated by bilinear interpolation. Assuming that the evaluation point H1 has been specified in the illustrated example of FIG. 6, a back scattering intensity at the specified evaluation point H1 is calculated or evaluated on the basis of respective back scattering intensities of mesh 0 to mesh 3.

The following paragraphs describe, with reference to FIG. 7, a sequence of operations (procedure) for calculating the back scattering intensity by the bilinear interpolation. FIG. 7 is a conceptual diagram explanatory of the sequence of operations (procedure) for calculating the back scattering intensity by the bilinear interpolation.

Let it be assumed that coordinates of the respective center points of the surrounding four meshes including the specified evaluation point are (x, y), (x+m, y), (x+m, y+m) and (x, y+m), respectively, and that back scattering intensities at the individual coordinates are f0, f1, f2 and f3, respectively. In such a case, a back scattering intensity at a given evaluation point (x+dx, y+dy) located inwardly of the respective center points of the four meshes can be evaluated using Mathematical Expression 17 below.

[Mathematical Expression 17]
$$f(x+dx, y+dy) = f_0 + (f_1 - f_0)\frac{dx}{m} + (f_3 - f_0)\frac{dy}{m} + (f_0 - f_1 + f_2 - f_3)\frac{dxdy}{m^2}$$

At step S47, a determination is made as to whether the aforementioned operations have been performed for all of the evaluation points. If the aforementioned operations have not been performed for all of the evaluation points as determined at step S47 (i.e., NO determination at step S47), the process reverts back to the operation of step S45. If, on the other hand, the aforementioned operations have been performed for all of the evaluation points as determined at step S47 (i.e., YES determination at step S47), the process for calculating stored energy contributed by back scattering is brought to an end. In the aforementioned manner, stored energy contributed by the back scattering is evaluated for each of the evaluation points. The instant embodiment of the invention can evaluate, at a high calculating speed, stored energy contributed by the back scattering by segmenting a chip range into a plurality of meshes and calculating an interaction of each of the meshes instead of calculating interaction of each of the rectangles.

Referring now back to FIG. 2, $(p_k \cdot q_k)$ and $(r_k \cdot r_k)$ of all of the rectangles of the figures Z1 to Z7 are summed together at step S5; namely, $\Sigma p_k q_k$ and $\Sigma r_k r_k$ are evaluated at step S5. At next step S6, a calculation of $\alpha_k = \Sigma r_k r_k / \Sigma p_k q_k$ (which corresponds to the calculation of Mathematical Expression 8 in the operational sequence (procedure) of the conjugate gradient method) is performed. At following step S7, x and r of all of the rectangles of the figures are updated with:

$x_{k+1} = x_k + \alpha_k p_k$ (which corresponds to the calculation of Mathematical Expression 9 in the operational sequence of the conjugate gradient method); and $r_{k+1} = r_k - \alpha_k p_k$ (which corresponds to the calculation of Mathematical Expression 10 in the operational sequence of the conjugate gradient method).

At next step S8, $(r_{k+1} \cdot r_{k+1})$ of all of the rectangles of the figures are summed together (hereinafter referred to as "ΣrrNext"). Then, at step S9, a determination is made as to whether ΣrrNext is sufficiently small, i.e. whether a calculation error has become smaller than a preset allowance. If ΣrrNext is sufficiently small as determined at step S9 (i.e., YES determination at step S9), the repeated calculations are terminated, and a column vector x is output as an optimal irradiation amount of each of the rectangles at step S13.

If, on the other hand, ΣrrNext is not sufficiently small as determined at step S9 (i.e., NO determination at step S9), operations of steps S10, S11 and S12 are performed, after which the process reverts back to the operation of step S4 to repeat the aforementioned calculation operations. At step S10, $\beta_k = \Sigma rrNext / \Sigma r_k r_k$ (which corresponds to the calculation of Mathematical Expression 11 in the operational sequence of the conjugate gradient method) is evaluated. At step S11, p in all of the rectangles of the figures is updated with $p_{k+1} = r_{k+1} + \beta_k p_k$ (which corresponds to the calculation of Mathematical Expression 12 in the operational sequence of the conjugate gradient method). Then, at step S12, "1" is added to the number of repetitions (which corresponds to the calculation of Mathematical Expression 13 in the operational sequence of the conjugate gradient method).

Note that a repetition condition for determining whether the aforementioned calculation operations are to be repeated or not is not limited to the one based on whether ΣrrNext is large or small (see step S9). For example, numbers of repetitions that converge may be researched in advance through simulation or the like to set a particular number of repetitions, or there may be employed a scheme of confirming that the calculation error has become no longer fluctuating even when the repeated calculations are performed. Note that, logically, the maximum (upper-limit) number of the repetitions is m.

As set forth above, the instant embodiment of the invention evaluates an optimal irradiation amount of the electron beam by correcting a proximity effect by use of the conjugate gradient method. Namely, for that purpose, the instant embodiment evaluates stored energy, which is a substantive electron beam irradiation amount, for each of segmented regions obtained by segmenting a pattern to be drawn onto a sample and then evaluates an electron beam irradiation amount optimal to reduce variation in size of a circuit pattern, caused due to a proximity effect, by the conjugate gradient method using the evaluated stored energy of each of the segmented regions. More specifically, in the operational sequence (see Mathematical Expression 8 and Mathematical Expression 10), including a calculation of the determinant $Ap_k$, of the repeated calculation sequence or procedure (see Mathematical Expression 8 to Mathematical Expression 13) based on the conjugate gradient method for finding a solution to a simultaneous linear equation with the matrix A as a coefficient, the instant embodiment performs calculations using the evaluated stored energy instead of performing a calculation of the determinant $Ap_k$. Further, in evaluating stored energy, the instant embodiment calculates stored energy by the front scattering of the electron beam and stored energy by the rear scattering of the electron beam separately from each other. Namely, if an optimal irradiation amount of the electron beam is evaluated in accordance with the repeated calculation procedure based on the conjugate gradient by managing the value of the determinant of $Ap_k$ with the stored energy like this, the instant embodiment can eliminate the need for taking the trouble of managing the huge matrix A, comprising a multiplicity of elements corresponding to miniaturization of the circuit pattern, and calculating the determinant $Ap_k$ as done in the conventionally-known method, and thus, the instant embodiment of the invention can evaluate an optimal irradiation amount of the electron beam with a high accuracy at a high processing speed, i.e. at a high calculating speed.

Although the preferred embodiment of the present invention has been described above with reference to the accompanying drawings, it should be appreciated that the present invention is not necessarily limited to the above-described embodiment, and various other embodiments and modifications are also possible. For example, whereas the embodiment has been described above in relation to the case where stored energy is calculated taking into consideration of respective influences of front scattering and back scattering, the present invention is not so limited, and for example, stored energy may be calculated with a numerical value evaluated from Mathematical Expression 18 used as an influence of the front scattering; in this way, the integral calculation can be dispensed with, so that the necessary calculations can be performed at an increased speed.

$$psf(r) = \frac{C}{1+\eta} \quad \text{[Mathematical Expression 18]}$$

Figure 8:
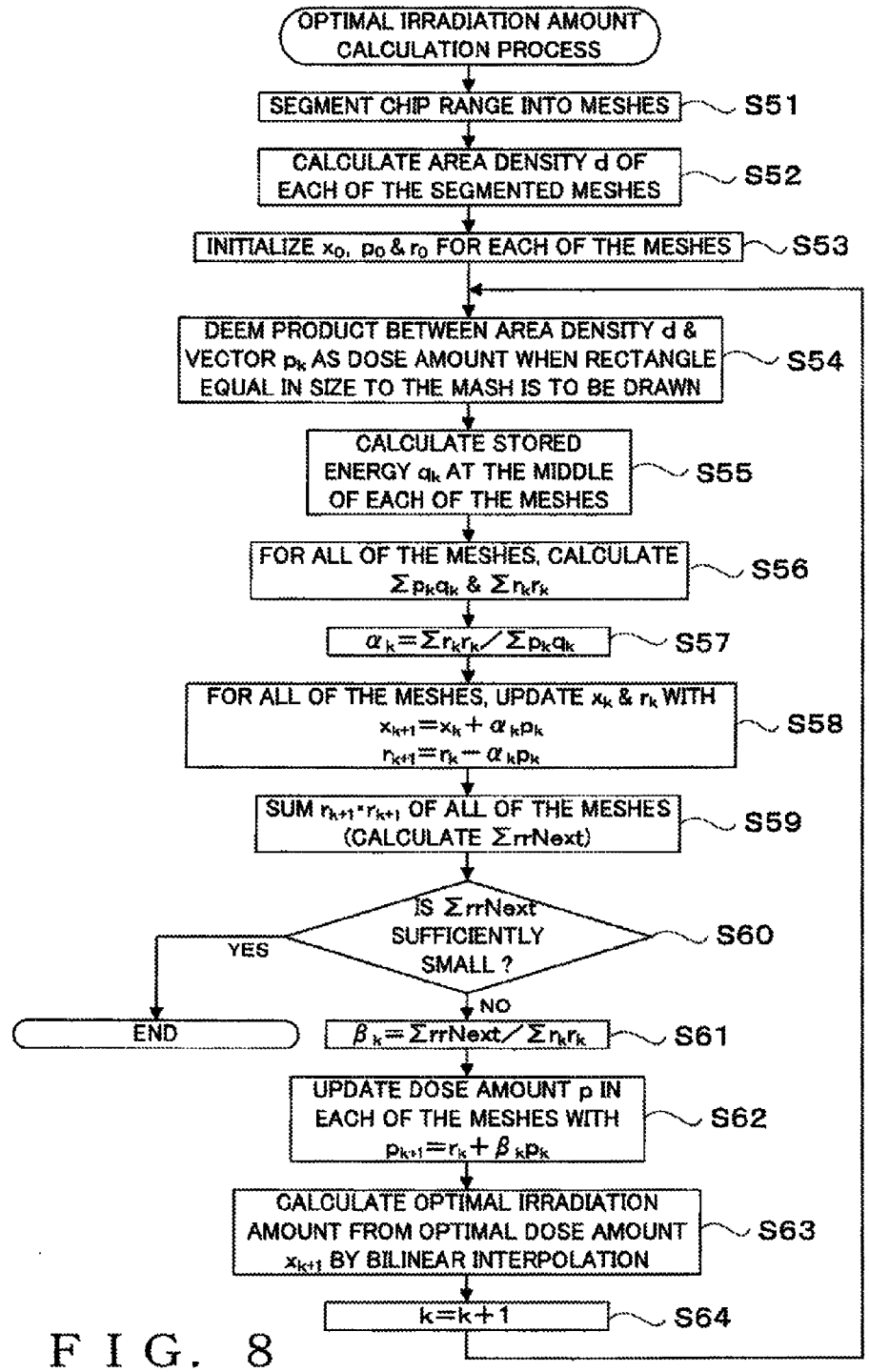
FIG. 8 is a flow chart showing an example of an optimal irradiation amount calculation process with an influence of the back scattering taken into consideration

Alternatively, stored energy may be calculated with only an influence of the back scattering taken into consideration and with an influence of the front scattering ignored. FIG. 8 shows an example of an optimal irradiation amount calculation process performed by the conjugate-gradient-method-based computing section 38 shown in FIG. 1 for calculating an optimal irradiation amount (optimal dose amount) for each of the rectangles with only an influence of the back scattering taken into consideration.

At step S51, a chip range is segmented into meshes (corresponding to regions) each having a predetermined size. At next step S52, an area density d of each of the segmented meshes; the "area density" here is a ratio of an area of figures included in the mesh to the total area of the mesh. At following step S53, as an initialization operation for solving the determinant Ax=b as shown in Mathematic Expression 1 above, initial value "0" is set as a (initial) dose amount of each of the meshes, and suitable target energy values are set as $p_0$ and $r_0$ ($b=b-Ax_0$). If the ordinary PEC method is employed, various information, such as the area density d, does amount x, conjugate vector p, residual error r, is preserved for each of the meshes, but, if the Gray Scale PEC is employed, the above-mentioned information is preserved for each of the meshes and in correspondence with the number of layers. Thus, if the Gray Scale PEC is employed, an optimal irradiation amount to be evaluated ultimately is also evaluated for each of the meshes and in correspondence with the number of layers.

At next step S54, a product between the area density d and the vector $p_k$ is calculated for each of the meshes and (for each of the layers if the Gray Scale PEC is employed; the same hereinafter), and the thus-calculated product between the area density d and the vector $p_k$ is deemed as a dose amount when a rectangle equal in size to the mesh is to be drawn. Then, at step S55, $Ap_k$ (see Mathematical Expression 8) appearing in the sequencing of operations for solving the determinant (A=b) with the conjugate gradient method is calculated by the stored energy calculation section 39. However, because an influence of the front scattering is ignored here, stored energy $q_k$ (back scattering intensity) at the middle position of each of the meshes based on the deemed dose amount is calculated only by the back scattering contribution calculation section 41.

At step S56, ($p_k \cdot q_k$) and ($r_k \cdot r_k$) of all of the meshes are summed together. Namely, $\Sigma p_k q_k$ and $\Sigma r_k r_k$ are evaluated at step S56. At next step S57, a calculation of $\alpha_k = \Sigma r_k r_k / \Sigma p_k q_k$ is performed. At following step S58, x and r of all of the meshes are updated with:

$x_{k+1} = x_k + \alpha_k p_k$; and $r_{k+1} = r_k - \alpha_k p_k$.

Then, at next step S59, ($r_{k+1} \cdot r_{k+1}$) of all of the meshes are summed together (hereinafter referred to as "ΣrrNext"). Then, at step S60, a determination is made as to whether ΣrrNext is sufficiently small, i.e. whether a calculation error has become smaller than a preset allowance. If ΣrrNext is sufficiently small as determined at step S60 (i.e., YES determination at step S60), the instant optimal irradiation amount calculation process is brought to an end.

If, on the other hand, ΣrrNext is not sufficiently small as determined at step S60 (i.e., NO determination at step S60), operations of steps S61 to 64 are performed, after which the process reverts back to the operation of step S54 to repeat the aforementioned calculation operations. At step S61, $\beta_k = \Sigma rrNext/\Sigma r_k r_k$ is evaluated. At next step S62, the dose amount p in each of the meshes is updated with $p_{k+1} = r_{k+1} + \beta_k p_k$. Then, at step S63, an optimal irradiation amount of each of the rectangles is calculated from the optimal dose amount $x_{k+1}$ by use of bilinear interpolation. At next step S64, "1" is added to the number of repetitions k.

According to such a modified embodiment, it is possible to evaluate stored energy contributed by the back scattering, by merely segmenting a chip range into a plurality of meshes and calculating an interaction of each of the segmented meshes, instead of calculating an interaction of each of the rectangles, as in the conventionally-known representative figure method. Then, using the thus-evaluated stored energy and the conjugate gradient method, it is possible to evaluate an optimal irradiation amount at each of the evaluation points at a high calculating speed. Particularly, in the case where the Gray Scale PEC is used, it is possible to perform, at a high speed, calculations of a dose amount distribution for realizing a three-dimensional shape following desired resist development, by setting appropriate target stored energy values of rectangles belonging to the individual layers (see step S53).

Note that a user may be allowed to select whether stored energy should be calculated with only an influence of the back scattering taken into consideration with an influence of the front scattering ignored, or stored energy should be calculated with not only an influence of the back scattering but also an influence of the front scattering taken into consideration. Alternatively, depending on whether the ordinary PEC is employed or the Gray Scale PEC is employed, a selection may be made automatically as to whether stored energy should be calculated with not only an influence of the back scattering but also an influence of the front scattering taken into consideration (in the case where the ordinary PEC is employed), or stored energy should be calculated with only an influence of the back scattering taken into consideration with an influence of the front scattering ignored (in the case where the Gray Scale PEC is employed).

Further, whereas the preferred embodiment of the invention has been described above in relation to the case where the PSF function is expressed by the Double Gaussian approximation equation shown in Mathematical Expression 3, the aforementioned Double Gaussian approximation equation is a mere example of the PSF function, and the PSF function may of course be expressed by another approximate equation. For example, in such a case, the PSF function (approximate equation) is determined depending mainly on an acceleration voltage of the electron beam and a material of the substrate.

Furthermore, whereas the embodiment has been described in relation to the case where the drawing method of the present invention is applied to the electron beam drawing device of a variable shaping beam type, the drawing method of the present invention is also applicable to drawing devices of other types. Further, the drawing method of the present invention is also applicable to an ion beam drawing device using an ion beam instead of an electron beam. Furthermore, the present invention is not limited to application purposes of electron beam drawing device. For example, the present invention is applicable to other purposes than forming a resist pattern directly on a wafer, such as creating an X-ray mask, optical stepper mask, reticle, etc. Moreover, the present invention may be modified variously within a range that does not depart from the gist of the present invention.

The invention claimed is:

1. A method of evaluating an optimal irradiation amount of an electron beam for drawing a given pattern onto the sample, said method comprising:
   a step of segmenting the given pattern into a plurality of regions;
   a step of evaluating, for each of the segmented regions, stored energy that is a substantive irradiation amount of the electron beam; and
   a step of evaluating the optimal irradiation amount for each of the regions on the basis of a conjugate gradient method using the stored energy evaluated for each of the regions.

2. The method as claimed in claim 1, wherein said step of evaluating the optimal irradiation amount for each of the regions on the basis of a conjugate gradient method uses the evaluated stored energy, instead of calculating a determinant $Ap_k$, in a following repeated calculation procedure based on a conjugate gradient method for finding a solution to a simultaneous linear equation of Ax=b with a matrix A as a coefficient:

$\alpha_k=(r_k \cdot r_k)/(p_k \cdot Ap_k)$ $x_{k+1}=x_k+\alpha_k p_k$ $r_{k+1}=r_k-\alpha_k Ap_k$ $\beta_k=(r_{k+1} \cdot r_{k+1})/(r_k \cdot r_k)$ $p_{k+1}=r_k+\beta_k p_k$ $k=k+1$.

3. The method as claimed in claim 1, wherein said step of evaluating the stored energy includes a step of calculating stored energy caused by front scattering of the electron beam, and a step of calculating stored energy caused by back scattering of the electron beam.

4. The method as claimed in claim 3, wherein said step of evaluating the stored energy evaluates stored energy in accordance with a stored energy distribution expression of $$e(x, y) = \int_b^t \int_l^r psf\left(\sqrt{(x-X)^2+(y-Y)^2}\right) dX dY,$$

where a PSF function in the expression is approximated by an approximation equation determined depending on an acceleration voltage of the electron beam and a material of a substrate, and wherein said step of evaluating the stored energy calculates stored energy caused by the front scattering or stored energy caused by the back scattering in accordance with the approximation equation.

5. The method as claimed in claim 4, wherein the approximation equation of the PSF function is $$psf(r) = \frac{C}{1+\eta}\left(\frac{1}{\alpha^2}\exp\left(-\frac{r^2}{\alpha^2}\right)+\frac{\eta}{\beta^2}\exp\left(-\frac{r^2}{\beta^2}\right)\right).$$

6. The method as claimed in claim 1, wherein said step of calculating stored energy caused by front scattering of the electron beam calculates stored energy for each of the regions by bilinear interpolation based on respective stored energy of adjoining ones of the regions.

7. An apparatus for evaluating an optimal irradiation amount of an electron beam for drawing a given pattern onto a sample by irradiating the electron beam in accordance with the evaluated optimal irradiation amount in a drawing device, the apparatus comprising:
   a segmentation section adapted to segment the pattern into a plurality of regions;
   a stored energy computing section adapted to evaluate stored energy for each of the segmented regions; and
   a conjugate-gradient-method-based computing section adapted to evaluate the optimal irradiation amount for each of the regions on the basis of a conjugate gradient method using the stored energy evaluated for each of the regions.

8. A non-transitory computer-readable storage medium containing a program executable by a computer to perform a method of evaluating an optimal irradiation amount of an electron beam for drawing a given pattern onto the sample, said method comprising:
   a step of segmenting the given pattern into a plurality of regions;
   a step of evaluating, for each of the segmented regions, stored energy that is a substantive irradiation amount of the electron beam; and
   a step of evaluating the optimal irradiation amount for each of the regions on the basis of a conjugate gradient method using the stored energy evaluated for each of the regions.

* * * * *